United States Patent [19]

Shimizu et al.

[11] Patent Number: 5,087,588
[45] Date of Patent: Feb. 11, 1992

[54] METHOD OF MAKING A SIDE WALL CONTACT WITH REACTIVE ION ETCHING

[75] Inventors: Masahiro Shimizu; Katsuhiro Tsukamoto, both of Hyoga, Japan

[73] Assignee: Mitsubishi Denki Kabushiki Kaisha, Tokyo, Japan

[21] Appl. No.: 548,335

[22] Filed: Jul. 5, 1990

Related U.S. Application Data

[60] Continuation of Ser. No. 511,818, Apr. 18, 1990, which is a continuation of Ser. No. 350,822, May 12, 1988, abandoned, which is a division of Ser. No. 146,384, Jan. 21, 1988, abandoned.

[30] Foreign Application Priority Data

Feb. 13, 1987 [JP] Japan .................................. 62-32002

[51] Int. Cl.⁵ ............................................ H01L 21/70
[52] U.S. Cl. ........................................ 437/191; 437/47; 437/48; 437/52; 437/60; 437/203; 437/919; 437/233
[58] Field of Search ..................... 437/47, 51, 52, 60, 437/193, 196, 233, 919, 228, 235, 48, 191; 357/236, 59

[56] References Cited

U.S. PATENT DOCUMENTS

| | | | |
|---|---|---|---|
| 3,936,331 | 2/1976 | Luce et al. | 437/233 |
| 4,305,200 | 12/1981 | Fu et al. | 351/59 K |
| 4,460,911 | 7/1984 | Salters | 357/23.6 |
| 4,577,395 | 3/1986 | Shubata | 437/919 |
| 4,581,815 | 4/1986 | Cheung et al. | 437/200 |
| 4,603,468 | 8/1986 | Lam | 437/164 |
| 4,657,628 | 4/1987 | Holloway et al. | 437/200 |
| 4,678,537 | 7/1987 | Ohuchi | 357/59 H |
| 4,700,457 | 10/1987 | Matsukawa | 437/60 |

FOREIGN PATENT DOCUMENTS

0082459 4/1986 Japan ................................ 357/236
0135119 6/1986 Japan .

Primary Examiner—Brian E. Hearn
Assistant Examiner—Tom Thomas
Attorney, Agent, or Firm—Lowe, Price, LeBlanc and Becker

[57] ABSTRACT

A semiconductor device comprises a P-type semiconductor substrate having a major surface, an insulating film formed on the major surface of the semiconductor substrate, a first polycrystalline silicon layer formed on the insulating film, an n+ diffused layer formed on the substrate and adjacent to an end portion of the first polycrystalline silicon layer, and a side wall formed on the end portion of the first polycrystalline silicon layer and formed of a second polycrystalline silicon layer for connecting the end portion of the first polycrystalline silicon layer with the n+ diffused layer.

1 Claim, 6 Drawing Sheets

METHOD OF MAKING A SIDE WALL CONTACT WITH REACTIVE ION ETCHING

This application is a continuation of application Ser. No. 07/511,818, filed Apr. 18, 1990, which is a continuation application of application Ser. No. 07/350,822, filed May 12, 1989, now abandoned, which is a divisional application of application Ser. No. 07/146,384, filed Jan. 21, 1988 now abandoned.

BACKGROUND OF THE INVENTION

1. Field of the Invention

The present invention relates to a semiconductor device and a method of manufacturing the same and, more particularly, it relates to a semiconductor device having a conductor film on an insulating film connected to a semiconductor substrate electrically and a method of manufacturing the same.

2. Description of the Prior Art

Electrical connections between the conductor film on the insulating film and the semiconductor substrate are necessary in many semiconductor devices and particularly it is significant on a memory cell portion of a dynamic-type semiconductor memory device. One example of such electrical connections is electrical connections between a capacitor electrode for storing information represented by an electric charge and a drain region of a transistor for reading and writing of information represented by an electric charge.

Figure 1:
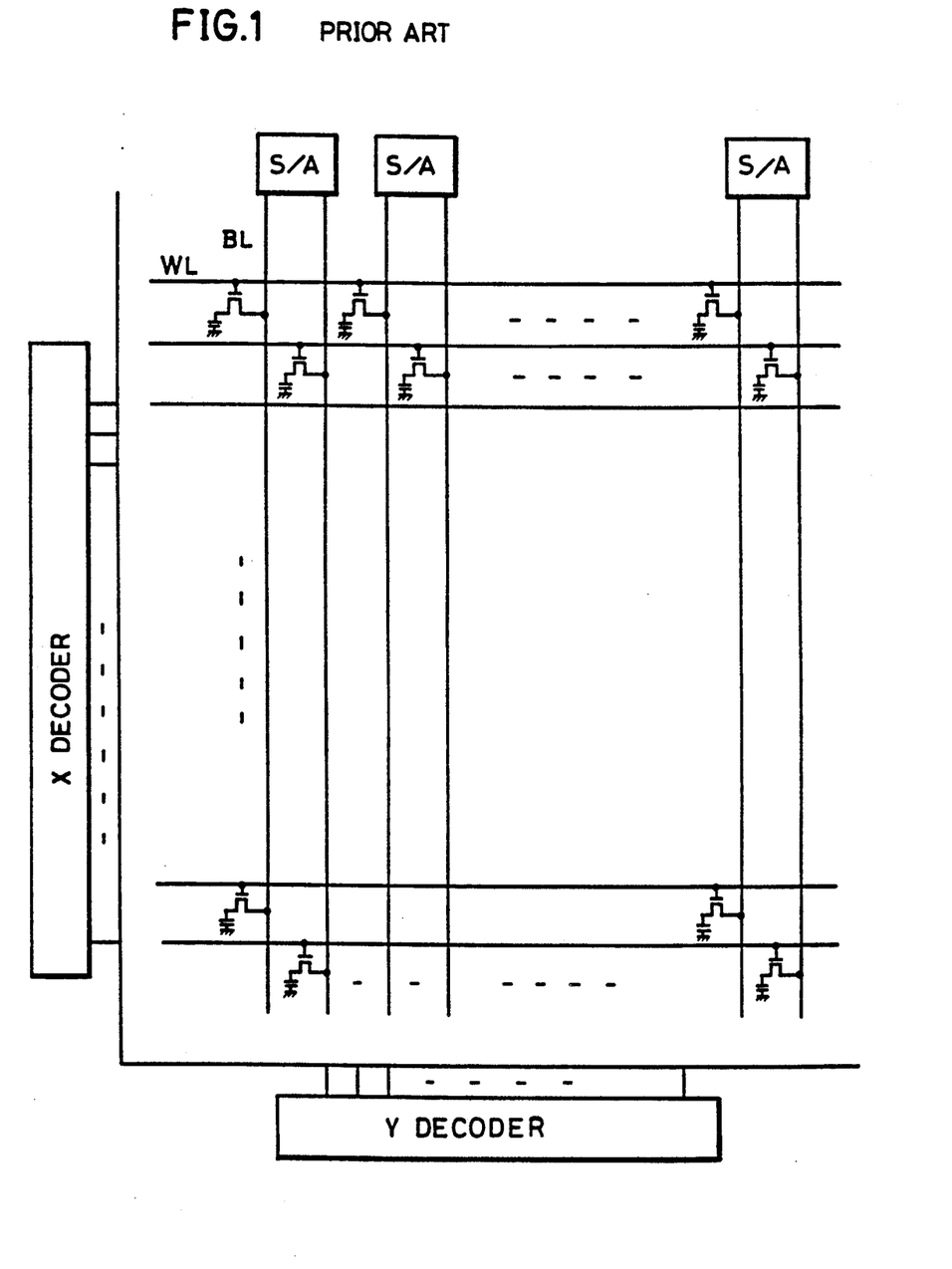
FIG. 1 is a block diagram showing a whole structure of a dynamic-type semiconductor memory device.

FIG. 1 is a block diagram showing a whole structure of a dynamic-type semiconductor memory device.

Referring to FIG. 1, the dynamic-type semiconductor memory device comprises an array comprising a plurality of memory cells serving as a memory portion, an X decoder and a Y decoder for selecting its address, and an input/output interface portion comprising a sense amplifier connected to an input/output buffer. A plurality of memory cells serving as a memory portion are connected to each of intersection points of word lines connected to the X decoder and bit lines connected to the Y decoder, these word and bit lines constituting a matrix. The above-mentioned array is thus implemented.

Next, an operation is described. The memory cell at an intersection point of the word line and the bit line is selected, when those lines are selected by the X decoder and the Y decoder in response to a row address signal and a column address signal externally provided, and information is read or written from or to the memory cell through the input/output interface portion comprising the sense amplifier and the input/output buffer.

Figure 2A:
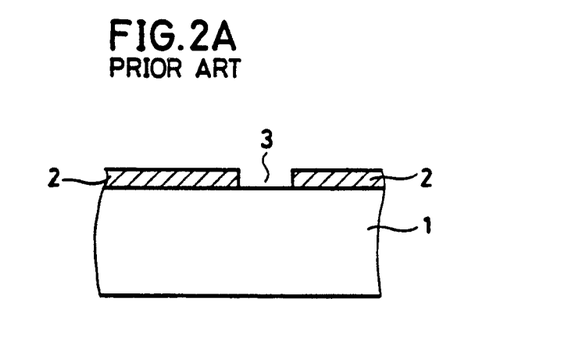
FIGS. 2A-2C are diagrams showing a method of electrical connections between a metal film on a conventional insulating film and a semiconductor substrate.
Figure 2B:
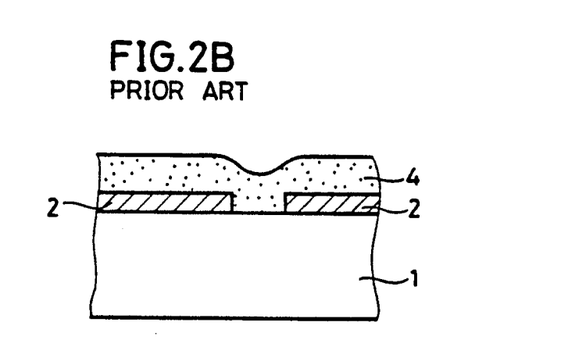
Figure 2C:
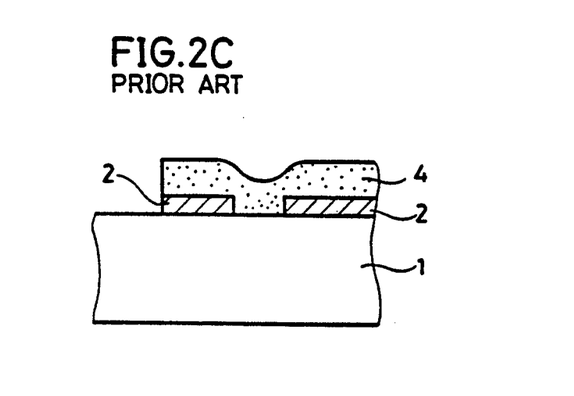

FIGS. 2A–2C are diagrams showing one example of conventional electrical connections between a conductor film on an insulating film and a semiconductor substrate. The shown example, particularly, is an example of connections on a memory cell portion of a dynamic-type semiconductor memory device. An insulating film 2 is formed on the semiconductor substrate. A window (serving as a connection portion) is formed on the insulating film by a photolithography (FIG. 2A). A polycrystalline silicon film 4 serving as a wire layer is formed on the insulating film (FIG. 2B). At this time, an impurity such as arsenic, phosphorous and boron may be implanted into the polycrystalline silicon film using an electric furnace or an ion implantation method. Then, a resist is applied to a desired position on the polycrystalline silicon layer and a patterning is performed, whereby the wire layer is formed (FIG. 2C).

In the conventional method of electrical connections, a window on the insulating film 2 for connecting the polycrystalline silicon film 4 on the insulating film 2 with a semiconductor substrate 1 must have been formed using a photolithography. Thus, minute processing of the window was difficult. In addition, since the insulating film 2 is usually used as the gate insulating film, a gate insulating film could be badly influenced by impurities in the resist.

Figure 3A:
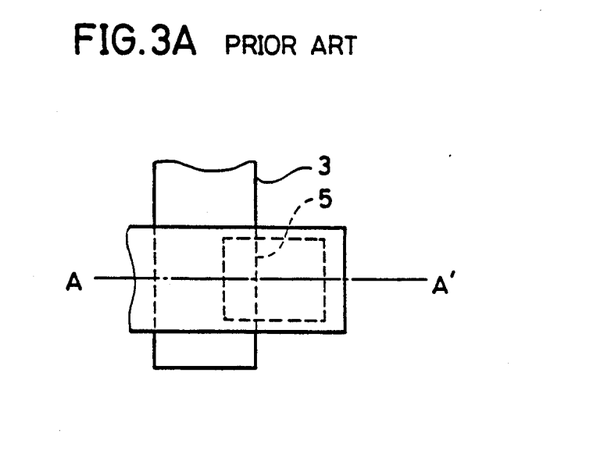
FIGS. 3A and 3B are diagrams showing a method of electrical connections between a metal film on another conventional insulating film and a semiconductor substrate
Figure 3B:
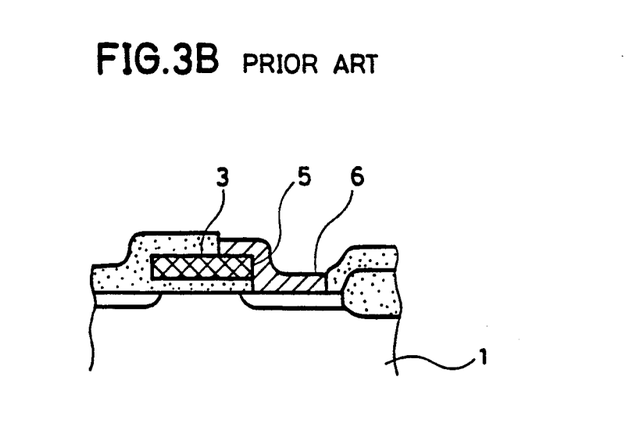

A method of electrically connecting the conductor film on the insulating film to the semiconductor substrate other than the above-mentioned method is described in Japanese Patent Laying-Open Gazette No. 175846/1983 and 216447/1986. FIGS. 3A and 3B are diagrams showing the method of electrical connections described in the latter mentioned literature. FIG. 3A is a plan view of an electrically connected portion and FIG. 3B is a sectional view taken along the line A—A' in FIG. 3A. Referring to the figures, connections between a gate 3 formed of the polycrystalline silicon layer and the substrate 1 are made through a wire layer 6 covering a step portion 5. The wire layer 6 is formed by a selective epitaxial growth of silicon. A single crystal layer is formed on silicon of the substrate 1 and a polycrystalline silicon layer is formed on polycrystalline silicon layer of the gate 3.

In the above-mentioned method, there were problems that when the impurity is implanted into the inside of the silicon layer, it is difficult to control it because the silicon layer formed by an epitaxial growth comprises two kinds of the single crystal silicon layer and polycrystalline silicon layer. Also, it is difficult to form a minute contact hole smaller than 0.5μ since a portion formed by the selective epitaxial growth, that is, a contact portion is formed using the photolithographic process. It is still further difficult to form a minute contact hole in alignment precisely, so that problems were caused that the above mentioned method is poor in repeatability and it is not suitable for a minute processing.

SUMMARY OF THE INVENTION

Therefore, it is a main object of the present invention to provide a semiconductor device and a manufacturing method of the same which is suitable for a minute process, which is not badly influenced by the impurities in the resist, and in which it is easy to control the doping of the impurity into the silicon layer serving as a connection layer.

The above mentioned object of the present invention can be achieved by connecting the conductor layer such as the polycrystalline silicon on the insulating film to the semiconductor substrate in a self-alignment without using the photolithographic technique nor the epitaxial growth method.

Briefly stated, a semiconductor device in accordance with the present invention is structured such that a side wall of a second conductor layer such as polycrystalline silicon is formed in self-alignment on a side wall of a first conductor layer such as polycrystalline silicon formed on the insulating film, and the semiconductor substrate is connected together with the first conductor layer such as polycrystalline silicon formed on the insulating film through this side wall.

Since the semiconductor device in accordance with the present invention is thus structured, it is not necessary to apply the resist onto the insulating film and in addition the gate insulating film is not badly influenced by the impurities in the resist. In addition, a meritorious effect is brought about that a minute processing can be carried out because the photolithographic process can be dispensed with.

Another meritorious effect is brought about that it is easy to control the doping of the impurity into the silicon layer serving as the connection layer since the epitaxial growth method is not used.

In a preferred embodiment, the semiconductor device comprises a semiconductor substrate having a main surface, a polycrystalline silicon layer serving as a wire layer or gate electrode formed on the semiconductor substrate with an insulating film interposed therebetween, and a side wall formed in self-alignment in connection with an end portion of the polycrystalline silicon layer and the substrate surface.

Since the semiconductor device is thus structured, problems can be avoided that would be caused if the photolithographic process and epitaxial growth method were employed.

In the still preferred embodiment, the semiconductor substrate having a main surface is provided, the insulating layer is formed on the semiconductor substrate, a first polycrystalline silicon layer serving as the wire layer or the gate electrode is formed on a predetermined position of the insulating layer, a window for connecting the semiconductor substrate with the first polycrystalline silicon layer is formed by removing a portion of the insulating layer adjacent the under portion of the end portion of the first polycrystalline silicon layer, the first polycrystalline silicon layer, the semiconductor substrate and the window are covered with a second polycrystalline silicon layer, the side wall is formed in self-alignment by a reactive ion etching from the upper portion, and connections are made between the first polycrystalline silicon layer and the semiconductor substrate through the side wall.

Since the polycrystalline silicon on the insulating film is connected with the semiconductor substrate by forming the side wall in the above-mentioned manner, a problem can be avoided that would be caused if the photolithographic process and epitaxial growth method were employed, and also a meritorious effect is brought about that it is easier to control a doped impurity when an impurity doping is made to the side wall as compared with the case in which the connection layer is formed by the epitaxial growth method.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Referring to the figures, several embodiments in accordance with the present invention are described in the following.

Figure 4A:
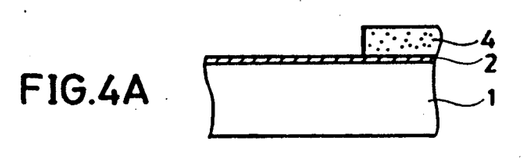
FIGS. 4A-4J are sectional views of a semiconductor device in several different steps of a manufacturing method of the semiconductor device in accordance with the present invention.
Figure 4B:
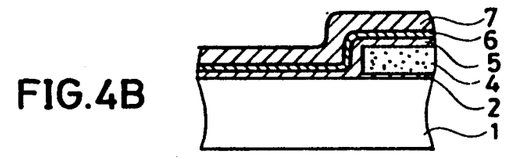
Figure 4C:
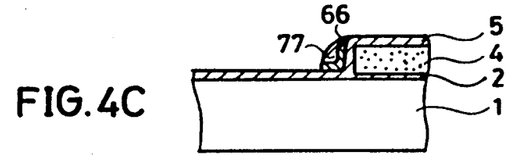
Figure 4D:
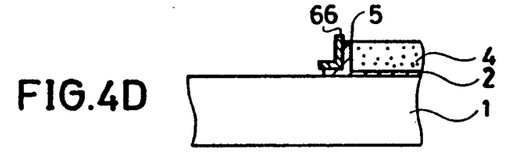
Figure 4E:
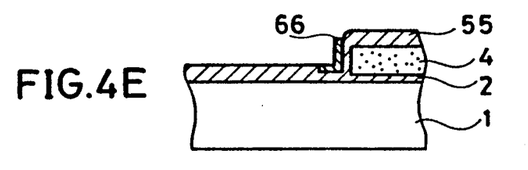
Figure 4F:
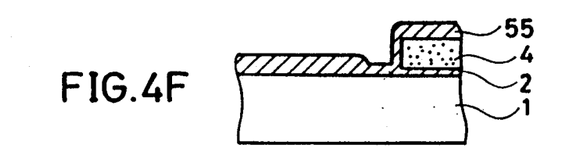
Figure 4G:
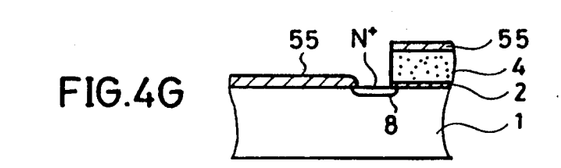
Figure 4H:
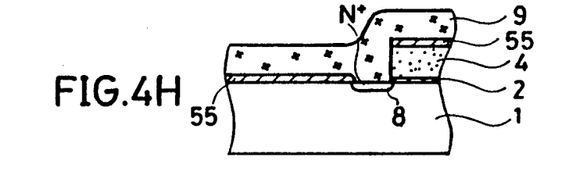
Figure 4I:
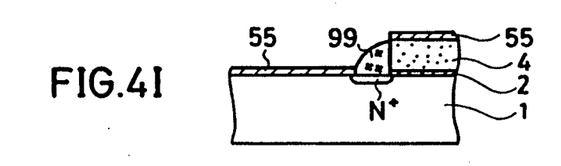
Figure 4J:
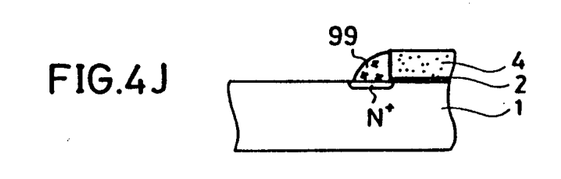

First, referring to FIG. 4J, a semiconductor device shown in the embodiment comprises a P-type semiconductor substrate having a main surface, the insulating film 2 formed on the main surface of the semiconductor substrate 1, the first polycrystalline silicon layer 4 formed on the insulating film 2, an n+ diffused layer 8 formed adjacent to an end portion of the first polycrystalline silicon layer on the substrate, and a side wall 99 formed of the second polycrystalline silicon layer for connecting an end portion of the first polycrystalline silicon layer to the n+ diffused layer 8.

Since both the first polycrystalline silicon layer 4 constituting the wire layer and the side wall 99 formed of the second polycrystalline silicon layer are made of polycrystalline silicon, it is easy to control a diffusing condition and the like when an impurity is diffused therein. In this respect, the semiconductor device in accordance with the present invention is superior to other semiconductor device, for example, a semiconductor device having a wire structure comprising a single crystal and polycrystal.

Referring to FIGS. 4A-4J, a manufacturing method of a semiconductor device according to one embodiment of the present invention is now described. First, the P-type semiconductor device is provided. After the insulating film 2 is formed on the P-type semiconductor substrate, the first polycrystalline silicon layer 4 is selectively formed on the substrate 1 (FIG. 4A). Then, as shown in FIG. 4B, after an oxide film 5 is formed on the insulating film 2 and the first polycrystalline silicon layer 4, a nitride film 6 and an oxide film 7 are formed by a vacuum CVD method and the like. Then, side walls 66 and 77 of the nitride film 6 and the oxide film 7 are formed by a reactive ion etching on the end portion of the first polycrystalline silicon 4 in self-alignment (FIG. 4C).

Now the RIE technique employed in a manufacturing process of the present invention is described briefly hereinafter. RIE (Reactive Ion Etching) is a technique which has been recently developed considerably as a method of etching of various kinds of thin film in a manufacturing process of LSI because a high-precision processing of fine pattern less than 3 μm is possible. A reaction seed of RIE is an active ion in plasma and has a chemical and physical (principally chemical) reaction mechanism. A characteristics of the technique is that the etching has directional property and a so-called anisotropic etching is possible.

Figure 6:
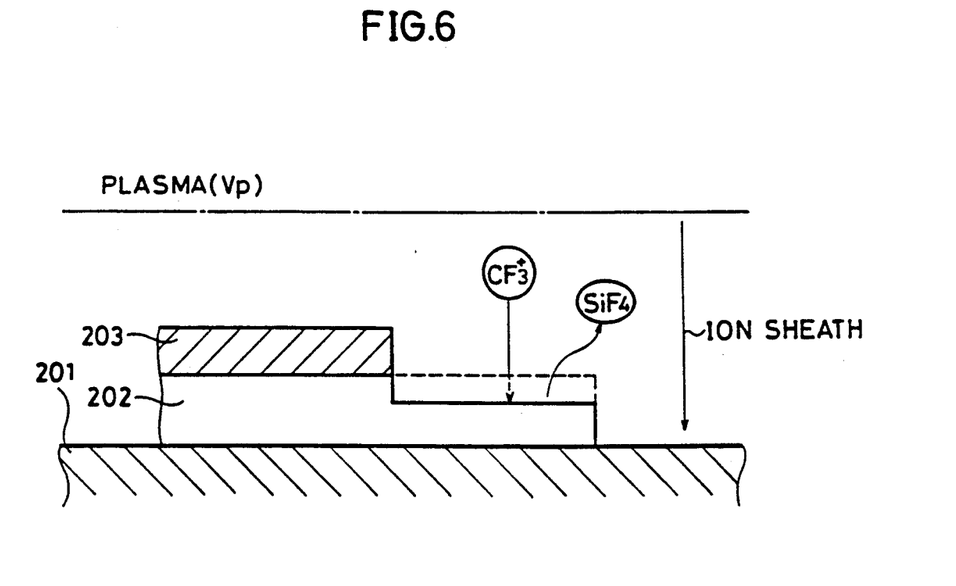
FIG. 6 is a view showing a basic reaction model of RIE.

A basic reaction mechanism of RIE is described hereinafter. FIG. 6 is a view showing a basic reaction model of RIE. Referring to FIG. 6, reference numeral 201 denotes an electrode, reference numeral 202 denotes a silicon substrate placed on the electrode, reference numeral 203 is a resist formed on the silicon substrate surface 202, reference character $CF_3^+$ denotes a kind of active ion and reference character $SiF_4$ denotes a material produced after a chemical reaction. Referring to FIG. 6, an ion such as $CF_3^+$ is produced in plasma as one example. Since an ion sheath appears naturally around the electrode, an ion sheath also exists on a sample surface placed on an electrode surface and potential grade is produced. An ion is accelerated towards an electric field by the potential grade. A potential is approximately several tens voltages through several hundreds voltages under a plasma condition for use in RIE usually, and this value varies depending on the circumstances in which RIE is performed, that is, a gas pressure, a high frequency power, the temperature of an electrode and the frequency of a power supply. The ion $CF_3^+$ accelerated in the ion sheath has a constant kinetic energy and collides with the substrate surface A. After that, a compound of $SiF_4$ is produced and an etching is performed after reaction by principally a chemical reaction. Since the reaction proceeds in a constant direction by a directional property of an impinging active ion (such as $CF_3^+$), an anisotropic etching can be performed.

As shown in FIG. 4D, the side wall 77 of the oxide film 7 and the oxide film 5 are removed by etching. The semiconductor substrate 1 and the first polycrystalline silicon layer are selectively oxidized using the side wall 66 of the nitride film 6 as a mask and an oxide film 55 thicker than the oxide film 5 is formed on the semiconductor substrate 1 and on the first polycrystalline silicon layer (FIG. 4E). After the side wall 66 of the nitride film 6 is selectively removed (FIG. 4F), the oxide film 55 is etched. Then, as shown in FIG. 4G, a portion of the P-type semiconductor substrate 1 is exposed. After that, an $N^+$ diffused layer 8 may be formed by implantation an impurity such as arsenic or phosphorous from the exposed portion. After the second polycrystalline silicon layer 9 is formed on the oxide film 55 and on the diffused layer 8 (FIG. 4H), a side wall 99 of the second polycrystalline silicon layer 9 is formed in self-alignment on an end portion of the first polycrystalline silicon 4 by a reactive ion etching (FIG. 4I). Then, the oxide film 55 is removed by etching to obtain a semiconductor device having the polycrystalline silicon layer 4 on the insulating film 2 connected with the $N^+$ diffused layer on the P-type semiconductor substrate 1 (FIG. 4J).

As mentioned above, in this embodiment, the side wall 99 of the second polycrystalline silicon 9 is formed in self-alignment on the end portion of the first polycrystalline silicon layer 4 formed on the insulating film 2, whereby the first polycrystalline silicon layer 4 is connected with the P-type semiconductor substrate 1.

Therefore, a resist need not be applied on the insulating film 2, and no bad influence is exerted by the impurity as in the conventional device. In addition, since photolithographic process is not necessary, a minute processing is easily performed. Since the silicon layer for connection is not formed using an epitaxial growth method, it is easy to control the implantation of the impurity into the silicon layer serving as a connection layer.

Although the above-mentioned embodiment is described as to a case in which the P-type semiconductor substrate is employed, it is obvious that the same effect can be attained even if an N-type semiconductor substrate is employed.

Although the above-mentioned embodiment is described as to a case in which no impurity is doped in the polycrystalline silicon, at least one impurity selected from the group consisting of arsenic, phosphorous, boron or antimony may be doped.

Figure 5A:
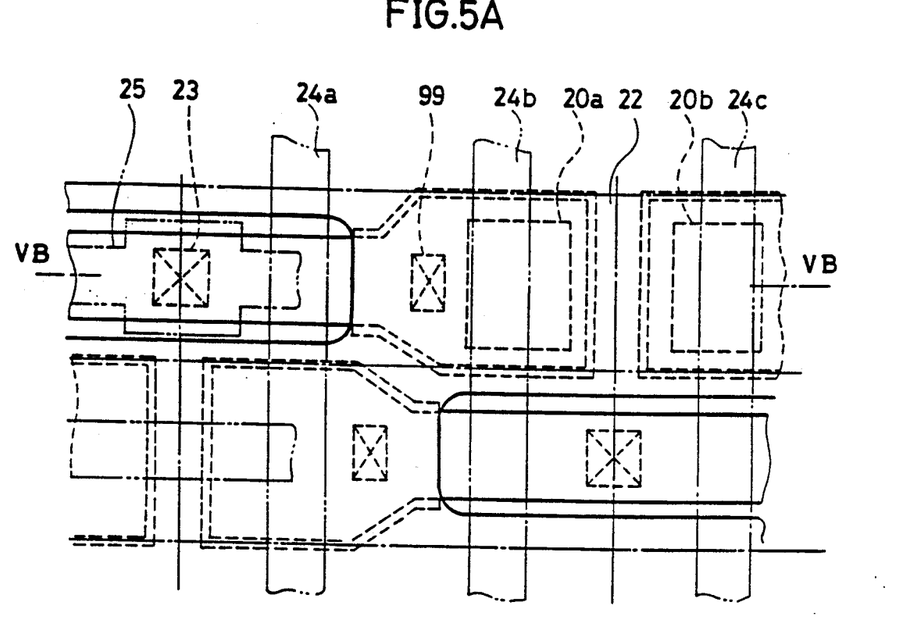
FIG. 5A and 5B are diagrams showing a trench type semiconductor memory device for showing a typical application example of the semiconductor device in accordance with the present invention.
Figure 5B:
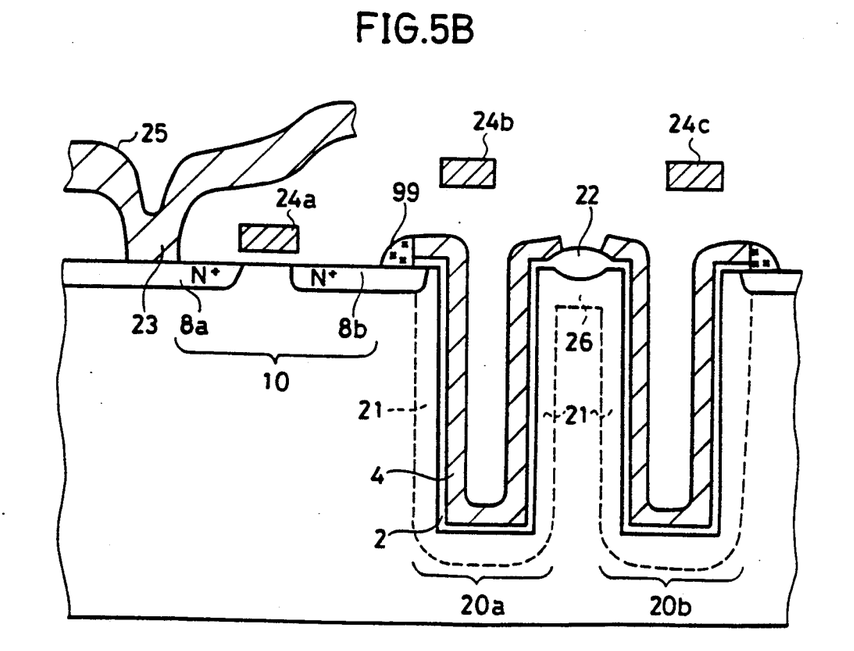

Referring to FIG. 5A and 5B, one application example of the present invention is described. FIGS. 5A and 5B are diagrams showing a trench-type semiconductor memory device. FIG. 5A is a plan view and FIG. 5B is a sectional view taken along line VB—VB of FIG. 5A.

The trench-type semiconductor memory device comprises capacitor portions 20a and 20b for storing electric charge representing information and an access transistor 10 for writing information represented by electric charge into the capacitor portions 20a and 20b and reading the same from the capacitor portions 20a and 20b. The capacitor portions 20a and 20b comprise a cell plate 4, a storage node 21 and the insulating film 2 placed therebetween. The access transistor 10 comprises a source 8a, a drain 8b and a gate electrode 24a. Information represented by an electric charge is written to the capacitor portions 20a and 20b and read from the capacitor portions 20a and 20b through a contact point 23 by controlling the gate electrode of the access transistor 10. The trench constituting the capacitor portions 20a and 20b is divided by an element isolating region 22 and a channel stop 26 formed thereunder.

Referring to the figure, the present invention is applied to the portion in which the drain portion of the access transistor 10 is connected with the cell plate 4 on the insulating film 2 constituting the capacitor portions 20a and 20b. Reference numeral 99 denotes a connection layer formed of polycrystalline silicon using a side wall to which the present invention is applied.

In accordance with the present invention, a meritorious effect is brought about that a dynamic type semiconductor memory device capable of high integration can be provided.

As mentioned above, in accordance with the present invention, after the side wall made of polycrystalline silicon was formed on an end portion of the polycrystalline silicon layer in self-alignment connections were made by the side wall between the semiconductor substrate and the polycrystalline silicon layer formed on the semiconductor substrate with the insulating film interposed therebetween. As a result, the semiconductor device having a connection structure between the semiconductor substrate and the polycrystalline silicon layer formed thereon with the insulating film interposed therebetween and a method of manufacturing the same can be obtained, which is suitable for a minute processing, in which an influence is not exerted by a resist used in the photolithographic process, and it is easy to control the doping of an impurity into the silicon layer serving as a connection layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A method of manufacturing a semiconductor device, comprising:
   forming a first insulating layer on the main surface of a substrate made of a material having an impurity of a certain conductivity type;

forming a first conductor layer on said first insulating layer above only a portion of the major surface of said substrate;

forming a second insulating layer above a remaining portion of the first insulating layer on the major surface of said substrate and above said first conductor layer;

removing a portion of said first and second insulating layers adjacent a sidewall of said first conductor layer to expose said substrate;

forming a second conductor layer on said exposed surface of said substrate and above said first conductor layer and said remaining portion of said substrate;

reactive ion etching said second conductor except at a region above said exposed portion of said substrate to form a sidewall contact; and removing said second insulating layer.

* * * * *